United States Patent
Lerner et al.

(10) Patent No.: US 7,625,805 B2
(45) Date of Patent: Dec. 1, 2009

(54) PASSIVATION OF DEEP ISOLATING SEPARATING TRENCHES WITH SUNK COVERING LAYERS

(75) Inventors: Ralf Lerner, Erfurt (DE); Uwe Eckoldt, Hohenfelden (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 73 days.

(21) Appl. No.: 10/586,621

(22) PCT Filed: Jan. 31, 2005

(86) PCT No.: PCT/DE2005/000145

§ 371 (c)(1),
(2), (4) Date: Aug. 18, 2008

(87) PCT Pub. No.: WO2005/074021

PCT Pub. Date: Aug. 11, 2005

(65) Prior Publication Data

US 2008/0315346 A1    Dec. 25, 2008

(30) Foreign Application Priority Data

Jan. 31, 2004    (DE) .................... 10 2004 004 942

(51) Int. Cl.
*H01L 21/76* (2006.01)
*H01L 21/461* (2006.01)
*H01L 21/302* (2006.01)
*H01L 21/311* (2006.01)

(52) U.S. Cl. .................. 438/424; 438/425; 438/426; 438/427; 438/428; 438/435; 257/E21.546; 257/E21.547; 257/E21.548; 257/E21.549; 257/E21.55

(58) Field of Classification Search .......... 257/E21.546, 257/E21.547, E21.548, E21.549, E21.55
See application file for complete search history.

(56) References Cited

U.S. PATENT DOCUMENTS

| 4,795,721 | A |   | 1/1989  | Bower et al. |
|-----------|---|---|---------|--------------|
| 4,952,524 | A | * | 8/1990  | Lee et al. .................... 438/437 |
| 5,440,166 | A |   | 8/1995  | Dixit et al. |
| 5,581,110 | A |   | 12/1996 | Razouk et al. |
| 5,933,746 | A |   | 8/1999  | Begley et al. |
| 6,531,377 | B2 |  | 3/2003  | Knorr et al. |
| 6,596,607 | B2 |  | 7/2003  | Ahn |
| 7,098,115 | B2 | * | 8/2006 | Tanaka et al. ............... 438/424 |

(Continued)

FOREIGN PATENT DOCUMENTS

DE    102 28 691 A1    3/2003

(Continued)

*Primary Examiner*—Charles D. Garber
*Assistant Examiner*—Mohsen Ahmadi
(74) *Attorney, Agent, or Firm*—Stevens & Showalter LLP (57) ABSTRACT

Trenches are formed in an SOI wafer to isolate low-voltage and high-voltage elements in the wafer. The isolation trenches are formed with trench coverings that do not protrude above the trenches. Vertical in-trench and horizontal out-of-trench isolation layers are formed and the trenches are then filled to above the planar surface formed by the isolating layers. The filling is planarized and a portion of the filling located in the trench interior is removed. A portion of the isolation layers are then removed and a portion of the filling is removed so that the filler and the isolation layers in the trenches are at about the same level. A covering layer is then deposited. The covering layer extends above the surface of the wafer and into the trenches down to the filler and the isolation layers. The covering layer is additionally planarized to about the top of the trenches.

32 Claims, 5 Drawing Sheets

U.S. PATENT DOCUMENTS

| | | |
|---|---|---|
| 2002/0025654 A1 | 2/2002 | Arita et al. |
| 2002/0072198 A1 | 6/2002 | Ahn |
| 2002/0076874 A1 | 6/2002 | Coolbaugh et al. |
| 2002/0119639 A1 | 8/2002 | Ridley et al. |
| 2003/0013271 A1 | 1/2003 | Knorr et al. |
| 2003/0013272 A1 | 1/2003 | Hong et al. |
| 2003/0235975 A1 | 12/2003 | Tran |
| 2004/0248375 A1* | 12/2004 | McNeil et al. ............ 438/435 |
| 2006/0228866 A1* | 10/2006 | Ryan et al. ............ 438/435 |

FOREIGN PATENT DOCUMENTS

| | | |
|---|---|---|
| EP | 1 184 902 A1 | 3/2002 |
| EP | 1 220 312 A1 | 7/2002 |
| JP | 63003429 A | 1/1988 |
| JP | 2000183156 A | 6/2000 |

\* cited by examiner

PASSIVATION OF DEEP ISOLATING SEPARATING TRENCHES WITH SUNK COVERING LAYERS

BACKGROUND OF THE INVENTION

1. Field of the Invention

The present invention relates to a method for processing or treating of semiconductor wafers including insulating isolation trenches for forming integrated semiconductor circuits, in particular directed at a reduction of a bending of the process wafer, thereby avoiding the creation of interfering crystal defects during the further process flow. The product by process without steps within the cap layer is also claimed.

2. Description of Related Art

For the integration of low voltage logic elements and high voltage power elements into the same silicon circuitry it is necessary to insulate chip areas from each other that have different potentials. One approach in this respect is the so-called dielectric trench isolation. In this case a first vertically acting insulation is formed between the device and the substrate by a buried insulating layer (typically comprised of silicon dioxide: $SiO_2$, in principle, any other insulating layers may be used). A further laterally acting (vertical) insulation is established by etching a trench down to the buried insulating layer of an SOI wafer and a subsequent refilling of this deep trench with insulating layers (insulating isolation trench). In this case only a portion or lateral section of the etched trench may be filled with an insulating material, the remaining fill process may then be performed on the basis of at least one conductive fill layer (e.g., polysilicon).

By means of so-called planarization steps, for instance appropriate etch processes or chemical mechanical polishing processes a planarization of the surface may be accomplished.

The representative prior art is found, for example, in EP-A 1 184 902 and EP-A 1 220 312. The process step for forming the insulating isolation trench is in the middle of the process flow, that is, further high temperature process steps follow. During the subsequent further manufacturing process also oxidation steps are required for thermally forming oxide layers. Thereby, an oxidation of the vertical side walls within the insulating isolation trench is induced. With the usual employment of polysilicon as fill layer there is additionally an oxidation of the polysilicon at the surface and also inside the filled insulating isolation trench.

Due to the higher specific volume of the created silicon dioxide compared to the polysilicon, significant compressive stress is generated in portions near the surface of the filled isolation trenches, thereby inducing an expansion of the isolation trenches and a bending of the silicon wafer as well as generation of crystalline defects in the adjacent single crystalline silicon areas, respectively. The crystalline defects impair the characteristics of the devices and result in increased defective goods, respectively. For this reason the trench areas are covered by an oxygen impermeable layer or a corresponding layer system, as is known from U.S. Pat. No. 5,933,746. Such cap layers are also described in U.S. Pat. No. 5,581,110, US-A 2002/0025654, JP-A 2000-183156 and JP-A 63-003429. A disadvantage of such cap layers designed in a known manner is that these layers extend above the planar surface, which entails disadvantages in the further manufacturing process. The layers form a step, which may negatively affect the formation of conductive lines extending across the step, for instance due to a reduced thickness at the line edges. Moreover, the cap layers are defined by an additional photolithographic process and are subsequently etched, that is, a photo mask has to be formed and deposited on the wafer, and there is the risk of a lateral misalignment of the photo mask.

BRIEF SUMMARY OF THE INVENTION

It is an object of the present invention to provide a technique for forming insulation trenches in SOI wafers, while avoiding the disadvantages of the cap layers of the insulation trenches protruding from the planar semiconductor surface and facilitating the process flow of a photolithography process. Furthermore, yield increase and reliability enhancement of integrated circuits having, in addition to low voltage logic elements also high voltage power elements, are to be taken into consideration and to be met.

The inventive solution proposes a method for forming a process wafer, wherein the formation is the treatment or the processing of an available SOI wafer, by forming specifically configured isolation trenches (claims 1, 27, 31). This enables an enhanced dielectric isolation of chip areas, which are or will be provided in the active semiconductor layer. One of the chip areas may be at a first potential and the other chip area may be at a different potential, wherein these potentials may exhibit a very high difference as a voltage or potential difference, so that low voltage logic elements may be provided in one area and high voltage power elements may be provided in a neighbouring different area. Both types of "elements" are referred to as devices in the context of semiconductor technology and may not further be explained, since these elements may be formed according to well-established conventional techniques.

The dielectric isolation is achieved by insulating regions comprising at least one trench, and preferably plurality of trenches, which isolate the chip areas from each other. Starting from a planar surface, from which the trenches extend downward, the trenches extend to a horizontally located buried insulating layer that is provided in SOI wafers. The isolation trenches comprise at least one oxidizing material, for example, a polysilicon used for filling, which oxidizes in an oxygen containing atmosphere at temperatures above room temperature. The oxygen containing atmosphere is prevented from entering the (insulating) areas of the trench filling by a cap sunk into the upper area of the trench according to the present invention. Despite the cap layer the surface may be designed in a planar manner, that is, above the trench and aside the trench laterally offset therefrom in regions extending in at least edge areas of the trench, and even across the entire surface of the active semiconductor layer of the SOI wafer.

When hereby "main process steps" are referred to during the manufacturing process, this is to be understood such that these process steps are emphasized in view of the object and the invention described and claimed herein; however, other processes, such as the integration and the processing of the low voltage elements and the high voltage elements or the etching of the trench structure are not to be excluded.

The following main processes are provided, when the processing or the treatment of the semiconductor wafer is demonstrated in a time sequence of the total process flow. Hereby, only one isolation trench is illustrated, although a plurality of such isolation trenches is provided on a processes wafer, wherein the plurality of isolation trenches electrically isolate high voltage elements and low voltage elements from each other. At least one of the trenches is the subject of the description and the claims, which may readily be extended to a plurality of such trenches.

At least one of the existing isolation trenches is provided with insulation layers, which extend as vertical insulation layers into the depth of the trench, thereby reaching to the horizontal (buried) insulation layer. At the same time a horizontal insulation layer is formed on the top of the active semiconductor layer. The fill material has a deep notch or indentation, which is still located above a height level of the horizontal insulation layer. Thus, a horizontal section of the deposited fill material, which not only fills the isolation trench but is also located above the horizontal insulation layer, also forms a fill material layer in this area. Insofar, it may be said more generally that "insulation layers are formed", which comprise horizontal and vertical portions or area sections. Both types of portions are covered by filling the at least one isolation trench.

In a further process step, the fill material layer is planarized. This is a "first planarization". Subsequently, a controlled back removal, in particular a defined back etching (back etch) is performed, which concerns the fill material in the interior of the trench, that is, below the planar surface, which is formed by the horizontal portion of the insulation layer. This removal into the trench provides for a reduction of the fill height of the trench including the oxidation sensitive fill material. This removal process is also referred to as an over-removal, which extends to "a first defined depth" of the trench, in any case to far above the trench bottom and only in the upper portion, preferably above half of the trench depth or even far above this half depth. The method is thus very appropriate for particularly deep trenches, which may extend through the entire active semiconductor layer to the buried insulation layer, not only into a certain portion of the semiconductor substrate. In this way, high voltage and low voltage at different chip regions may be reliably isolated, while avoiding oxidation influences at the surface of the trench, when this trench is filled with an oxidation sensitive material. In order to incorporate in the trench or lower the cap or cover layer provided for an oxidation barrier, a removal of a portion of the insulation layers and a further removal of a further portion of the fill material are performed.

Here, the respective vertical portions of the layers are involved and meant in order to obtain a substantially identical height level of these layers in the isolation trench or achieve the same by the additional removal process. The horizontal insulation layers are also removed so that a surface of the active semiconductor layer is exposed. This over-removal, in particular, a defined over-removal, provides a volume in the trench at the upper trench edge for accommodating a cap layer that is now to be incorporated, which extends above the level of the planar surface after deposition in the form of a layer or layer system, however, the cap layer extends downwardly to the substantially equal height level of the trench, supported by the remaining vertical layers in the trench, a fill layer and a residual insulation layer at both sides.

After the application of this cap layer, which is initially provided in a greater extent than required in a later stage, a further planarization process is performed. This further planarization reduces the cap, representing a functional description of a layer or a layer system, by evenly removing material using for instance a mechanical chemical polishing process or a further resist planarization process in order to again expose the surface of the active semiconductor layer, cover the trench in the upward direction in an oxide inhibiting manner, in particular in the area of the trench and near the trench, such that steps are avoided which would complicate the formation of horizontal conductive lines.

All of the described process steps are performed without an additional photolithography step; the only photo mask required is used for forming the trenches, in this case, the at least one described trench. In addition to avoiding further photo masks, there is also no requirement for aligning these further photolithography processes to each other, so that lateral misalignments of photo masks are avoided. Oxidations may no longer occur in the upper portion of the trench, thermal stress is avoided , or is at least significantly reduced. Further high temperature processes may follow the formation of the trench structure without a risk for generating thermal stress that would result from oxidation processes occurring in the upper trench portion. The process performance of the wafer is enhanced so that also yield may be increased.

If a plurality of layers are used as a layer system, at least one of the plurality of layers may be formed in a special way. In this case, on the one hand, the getter capability of ions may be taken into consideration, as well as a certain coefficient of thermal expansion. The lowered cap layer of the isolation trench enables the avoidance of a mutual negative influence of circuit portions and trench portions, such as the migration of ions. A layer component may also be used for adjusting the coefficient of thermal expansion of the total system.

Particularly advantageous is the usage of silicon nitride as an oxygen impermeable cap layer.

The product or intermediate product of the processed wafer or process wafer in the sense of an at least partially processed SOI wafer is the subject-matter of one aspect of the invention of the present application. The skilled person is able to determine the structure of the wafer treated or processed according to the method of the present application so that a relation to the manufactured product of a manufacturing or production method is possible.

The continuous planar surface relates to the cap layer and the neighbouring areas, which are chip regions provided for low voltage and high voltage. The plane is formed in a planar manner and does not form steps. The cap layer lowered into the trench also forms a laterally acting electrical insulation that extends across the entire trench width, while vertical insulation layers at the trench walls in the upper area of this cap layer are not involved. The latter insulations are formed by, for instance, thermal oxidation and are completely removed with regards to the horizontal portions in a later stage, with regards to the vertical portion being removed only to a certain extent in order to provide the space for the recessed cap layer. The back removal is defined and thus relates to a smaller piece of the vertical portions in the trench only. Nevertheless the removal on the trench is performed over the entire trench width between the trench walls, which are defined by the neighbouring portions of the active semiconductor layer.

It is to be appreciated that the cap layer is dielectrically insulating. It is also noted that the cap layer is an oxide barrier for the fill material provided below the cap layer. This cap layer is formed without a mask.

A dielectric insulation by means of trenches is also described in US-A 2003/0013272 (Hong) or in US-A 2003/0235975 (Tran). However, in these cases the trenches or their depths terminate in the homogenous semiconductor material, and at the end phase of the manufacturing process, a continuous planar surface corresponding to the surface level of the semiconductor wafer is typically not achieved. In the former document, the free surface remains covered by a double layer and is not planar. In the latter document the trenches are used for the isolation of differently doped regions. These regions are not provided for different potentials, such as high voltage and low voltage, that is, for accommodating power elements and logic elements, so that the trenches in the prior art may have to withstand, with respect to dimensions and design, very reduced potential differences.

BRIEF DESCRIPTION OF THE SEVERAL VIEWS OF THE DRAWINGS

The invention will be explained and supplemented by referring to embodiments including two semiconductor wafers and by using the accompanying drawings.

DETAILED DESCRIPTION OF THE INVENTION

Figure 1:
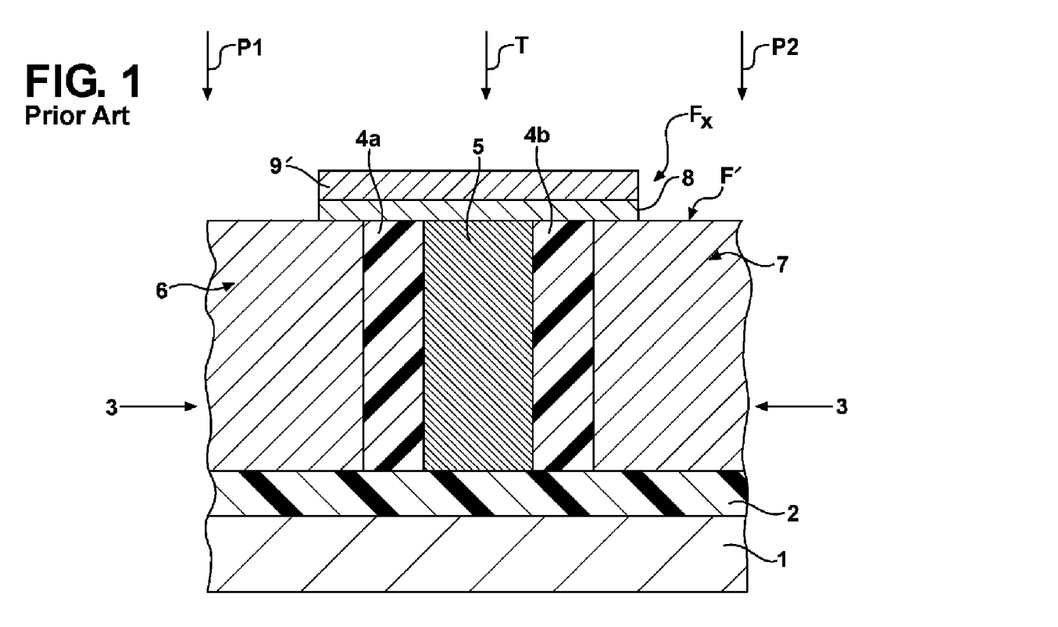
FIG. 1 illustrates the prior art.

FIG. 1 illustrates an isolation trench T according to a vertical section of a silicon on insulator (SOI) wafer, wherein cap or cover layers 8, 9' are provided. The cap layers 8 and 9' are located on the planar surface F' of the active semiconductor layer 3, thereby producing a disadvantageous step at Fx. The insulating trench T separates two regions 6, 7 of different potentials, wherein these regions 6, 7 are depicted while the different potentials are generated during operation of a completely processed wafer separated into individual devices having the semiconductor associated therewith. In addition to the trench T, the buried insulating layer 2 and the two insulating layers 4a, 4b, commonly referred to as "insulating layers 4" also provide for the dielectric insulation. The planar surface F' of the active semiconductor layer 3 has at least two lateral steps according to the covered embodiment of FIG. 1, thereby inducing the previously described drawback.

The SOI embodiment of FIG. 1 initially includes a carrier layer 1, an insulating layer 2 located thereon and the active semiconductor layer 3, which in this stage is already structured by the trench T and its vertical insulating layers 4a, 4b and a fill layer 5. Nevertheless, in the following this layer 3 shall be referred to as active semiconductor layer, including the buried insulating layer 2, to which extend the two vertical insulating layers 4a, 4b of the insulating layer 4.

Figure 2:
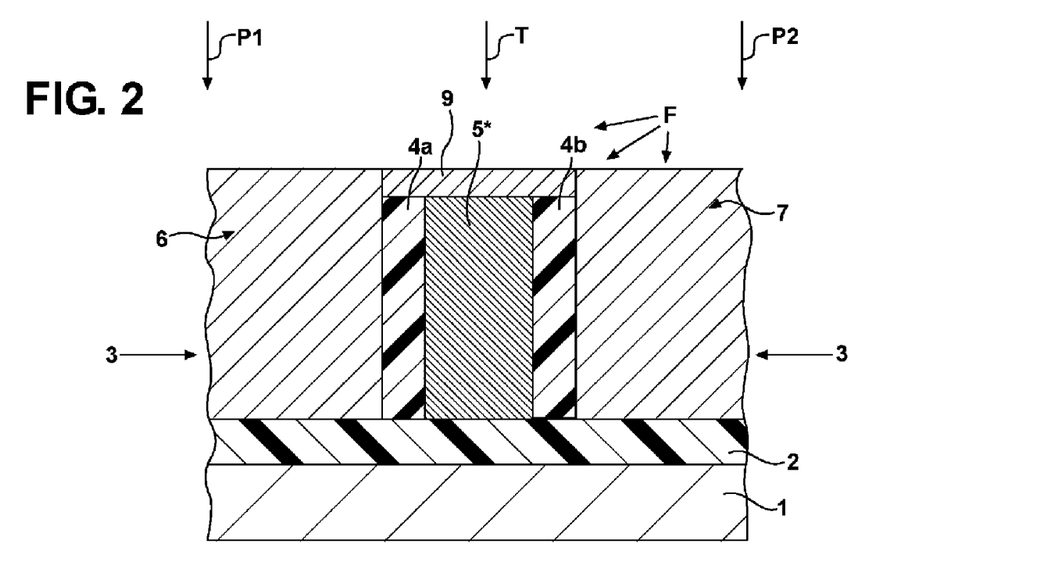
FIG. 2 illustrates an example of a covered trench according to the present invention.

In FIG. 2 there is shown an example of the novel trench structure. Here the cap layer 9 is provided such that it forms an even plane in combination with the planar surface F of the semiconductor wafer, i.e., there is no longer a step or a notch. In particular, at the trench and adjacent thereto no steps are provided, since the cap layer 9 is sunk into the trench. Like reference numerals identify like elements, wherein in the following a manufacturing sequence is described, with which the structure of FIG. 2 may be formed.

In use, the chip region 6 and the chip region 7 are provided with low voltage and high voltage elements, respectively, which are formed after the herein described formation of the trench structure by processes for semiconductor devices that are not specifically explained herein and that are generally known. It may be appreciated that a first potential (P1) is assigned to the chip region 6, and a second potential (P2) is assigned to the chip region 7. These chip regions 6, 7 are portions of the active semiconductor layer 3 that is preferably made of silicon.

It should be noted with respect to the former stepped trench structure shown in FIG. 1 that the arrangement of the trench area T (T indicates a "trench") and of the two potential areas P1 (region 6) and P2 (region 7) are also determined, insofar there is no difference. It is merely to be noted that the stepped cap of the prior art is made of an oxide layer 8, which covers the trench T and the fill layers 4a, 5, 4b contained therein, and is additionally covered by a cap 9', which additionally covers the insulated isolation trench T, such as $Si_3N_4$.

Figure 3A:
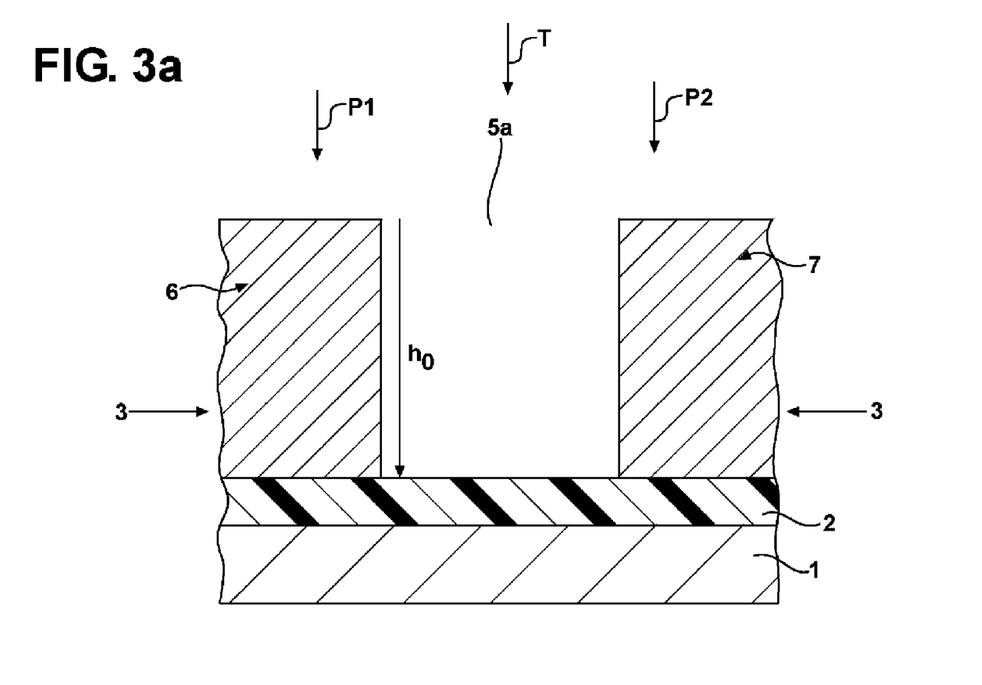
FIG. 3a to FIG. 3f are process stages of main process steps for forming an isolation trench having a planar end face of the oxygen impermeable cap layer, as is for instance shown in FIG. 2.
Figure 3B:
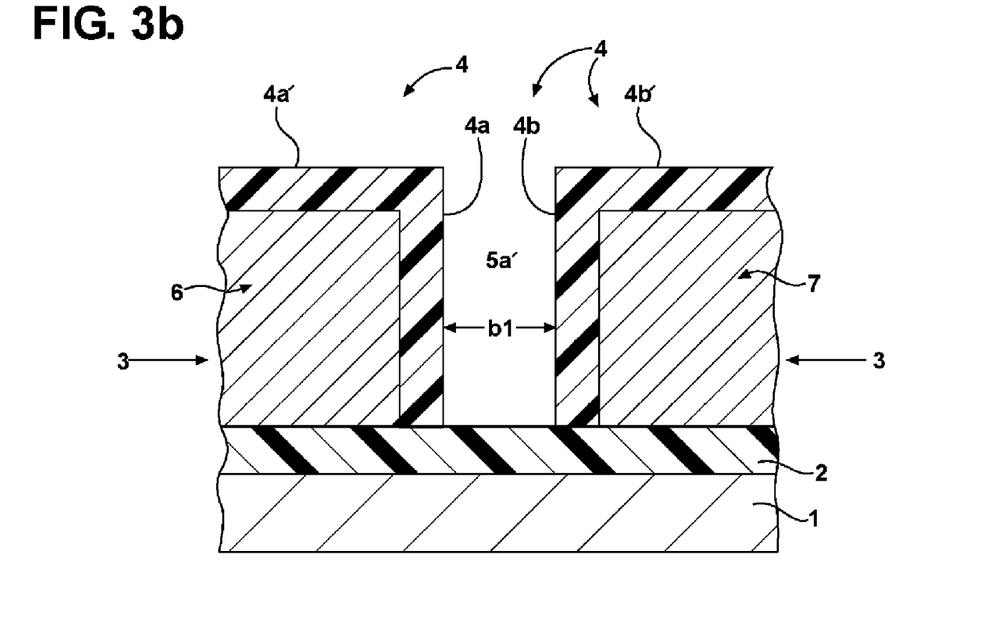
Figure 3C:
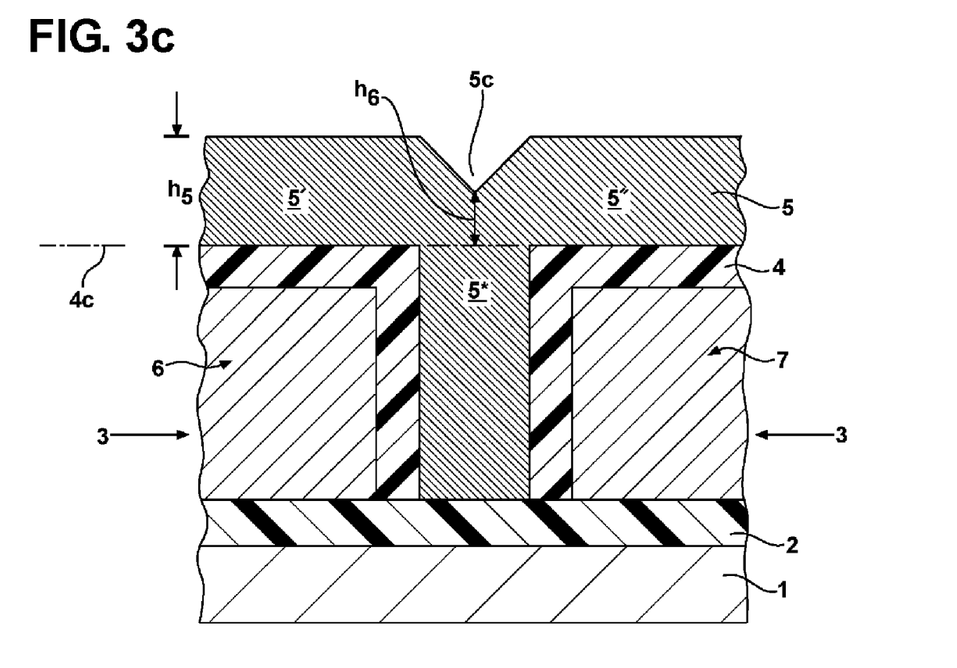
Figure 3D:
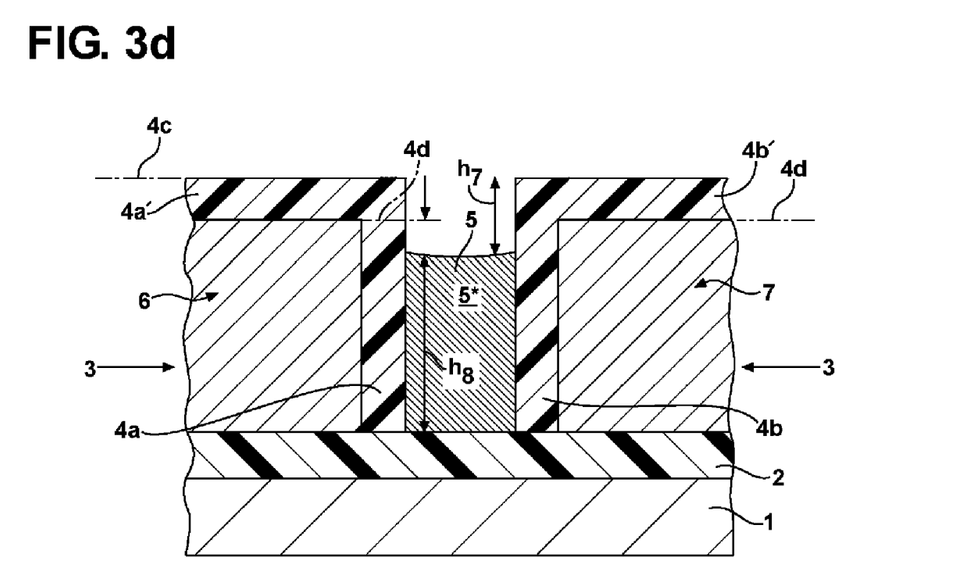

Using FIGS. 3a to 3f, a preferred method will briefly be illustrated. The isolation trench of FIG. 3a, here indicated as 5a and created by etching to the buried insulating layer 2, is provided with insulating layers 4, for instance by thermal oxidation. Thereby, the trench structure of FIG. 3b is obtained. After filling the trench 5a' for instance using polysilicon above the planar surface 4c, thereby forming a structure according to FIG. 3c, the fill material is planarized and subsequently etched back in a defined manner to form fill material 5* as shown in FIG. 3d.

Figure 3E:
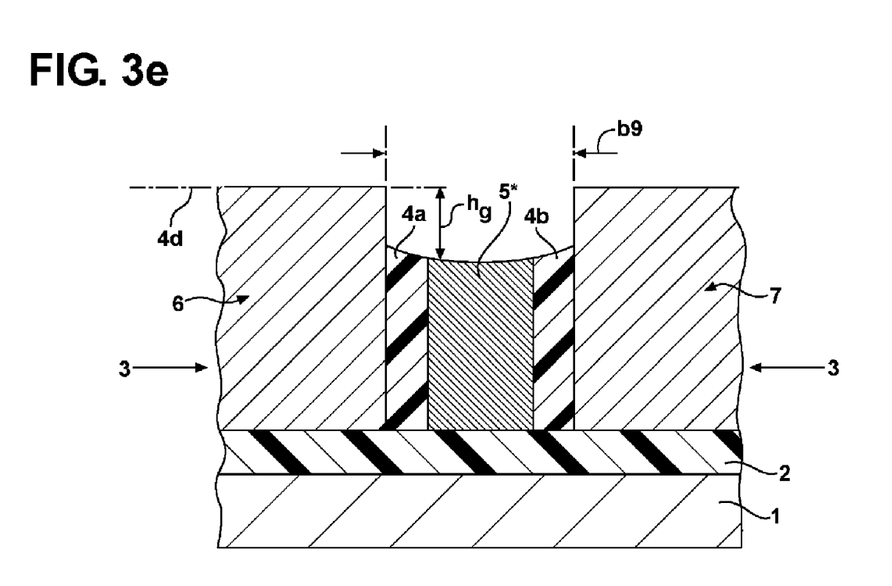
Figure 3F:
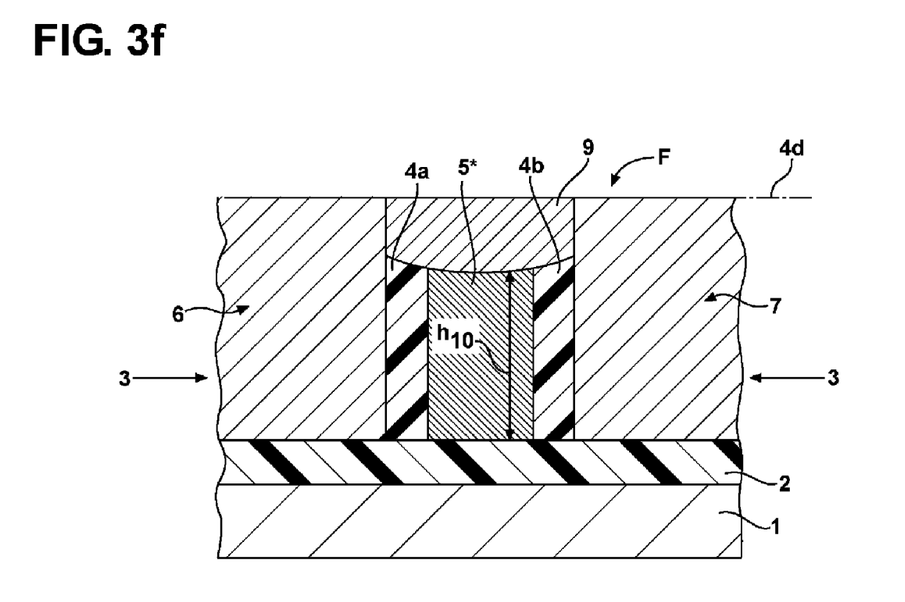

Thereafter a further etch back process of the insulating layers 4 including a defined over etch is performed so that the two layers 4a, 4b and the fill material 5* have substantially the same level, as is shown in FIG. 3e. Next, the cap layer 9 is formed and subsequently planarized, as is shown in FIG. 3f. This may be accomplished by a chemical mechanical polish process or by a resist planarization process, which are well-known and thus are not illustrated.

The method illustrated does not require any further photolithographic masks for forming the cap of the isolation trench, except for the mask for the isolation trench 5a.

The insulating isolation trench may also be covered such that a mutual adverse influence of the circuit areas and the interior of the trench is avoided in the further technological process flow, for instance the migration of ions. During the formation of the layer system having respective characteristics a layer component may also be used for adjusting the coefficient of expansion of the total system.

In detail, on the one hand, the method up to now will be explained and completed. The detailed description may, on the other hand, be considered as a further embodiment of alternative methods that are capable for producing the product of FIG. 2, whose real size and shape is demonstrated by FIG. 4.

The trench structure, one trench thereof being illustrated in cross-sectional view and which is formed by means of a first mask, is not explicitly shown as a mask, only the result of the method is shown The trench 5a, whose length direction extends into the depth direction of the drawing plane, has the depth $h_0$ as shown in FIG. 3a. It separates the left area, for instance used for the high potential P1, from the right area, used for instance for the low potential P2. The isolation area T, symbolizing the trench, creates a dielectric insulation, which will be described later on. Below the chip regions 6, 7 at the end of the active semiconductor layer 3, a horizontally buried insulating layer 2 is assumed, which is provided by the start wafer, that is, an SOI wafer that additionally comprises a carrier layer 1. The buried layer 2 has already been partially exposed by the trench, but will again be dielectrically covered by the following process steps in order to act as a barrier for the difference in potential P1-P2.

Insulating layers 4 are formed by thermal oxidation according to FIG. 3b, thereby resulting in a reduced width b1 of the trench 5a. The vertical portions of these insulating layers 4a and 4b are formed on the walls of the trench in an opposing relationship. Horizontal portions 4a' and 4b' belong to the insulating layers and are formed on the exposed active semiconductor layer 3 along with the vertical layer portions. A trench 5a' having a reduced width is obtained, which has an increased depth, since the horizontal portions 4a', 4b' provide, to some extent, for an additional vertical height at the top of the active semiconductor layer 3.

The two chip regions 6, 7 to be insulated remain unchanged throughout the entire sequence of FIGS. 3a-3f.

Next, a process step is performed to fill the trench 5a' of FIG. 3b as shown in FIG. 3c. This fill process is performed such that at least the one isolation trench is filled with a fill material, wherein a deepest indentation of notch 5c of a fill material layer 5', 5" formed at the surface is located with its top surface above a level 4c that is defined by a planar surface formed by the insulating layers 4 (the horizontal portions thereof) as shown in FIG.3c. The notch 5c is not depicted in a real manner and is not true to scale, but is a symbolic representation. The deepest level of the notch 5c as a deepest point has a height offset h6 with respect to the level 4c planar surface that is used as a reference plane. The filling of the isolation trench 5a' with the fill material defines a first portion 5*, which is also referred to as a vertical portion. Two horizontal portions having the same fill material are indicated as 5' and 5" that are located on respective opposing sides of the trench, that is, above the horizontal insulating layer 4a' at one side or above the horizontal insulating layer 4b' at the other side. At the trench 5a', the horizontal portion as fill material layer has an indentation.

The thickness of the horizontal portion 5', 5" of the fill material layer 5 is indicated as h5 and is somewhat greater than the thickness of the insulating layers 4.

The filling of the trench 5a with fill material provides the vertical portion of the fill material that extends beyond the planar surface 4c. This information, i.e., the extension beyond or above the level 4c of the surface, is defined by the surface or plane, which has the offset $h_5$ in the height direction, as shown in FIG. 3c. In an intermediate step with respect to FIG. 3d that is not shown, the horizontal portions 5', 5" of the fill material layer 5 are planarized, that is, material is removed, such that the insulating layers, i.e., their horizontal portions 4a', 4b', are again exposed. This is the first planarization.

Subsequently, a defined back-removal process, in particular in the form of a back etch process, is performed so as to obtain the trench structure according to FIG. 3d. This removal of an upper portion of the vertical portion 5* of fill material relates to a part of the fill material in the interior of the trench and extends to a defined depth h7. This depth extends below the previously indicated reference plane 4c, which is now defined by the exposed top surface of the horizontal portions of the insulating layer 4. The etch-back process is performed deeper than a second reference plane 4d, which is defined by the surface of the active semiconductor layer 3.

A height level h8 is obtained in the trench 5a', which corresponds to the fill material, in particular to the polysilicon. The defined depth obtained by the etch-back process, wherein the measure of the etch-back is indicated as h7 and the measure of the remaining trench is indicated as h8, merely corresponds to a small part of the trench depth according to FIG. 3d. It is etched down to only half of the trench depth or less, preferably to approximately ¼ of the trench depth or significantly less according to further embodiments.

Figure 4:
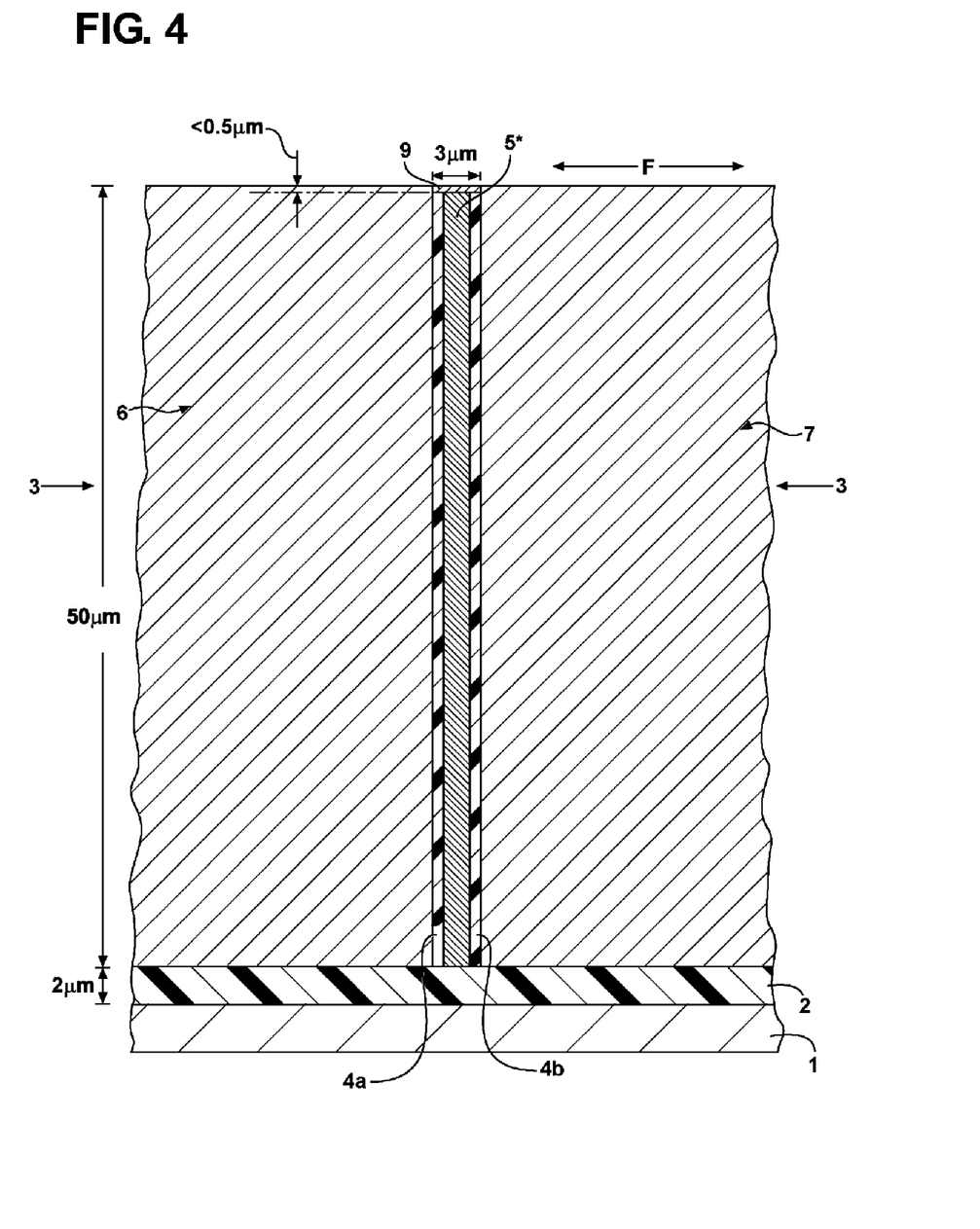
FIG. 4 is a trench structure according to a scale.

An example of such a real ratio is shown in FIG. 4.

Thereafter, the insulating layers 4 are further etched back, wherein here the horizontal insulating layers 4a', 4b' and a part of the vertical insulating layers 4a, 4b are involved. With this etch-back process a defined over-etch of the vertical fill material 5* is achieved such that the three vertical layers 4a, 5* and 4b have substantially the same height level as shown in FIG. 3e. This height level is obtained by the etch-back process using the measure h9 with respect to the surface 4d of the active semiconductor layer 3. The actual etch-back for obtaining the result of FIG. 3e relative to FIG. 3d is greater, since the horizontal insulating layers 4b' and 4a' are also removed.

Thus, a part of the insulating layers and a part of the vertical fill layer is removed in order to obtain and form a receiving portion that is located between the trench walls and is located more deeply than the surface of the active semiconductor layer 3. This layer is exposed according to FIG. 3e.

The opening provided has a width b9 and a depth h9, the latter is referred to the surface 4d. The application of a cap layer 9 results in a filling of the opening provided and concurrently covers the plane 4d so that it extends above the level of the planar surface. The extension above or protrusion is to be understood in the vertical, upward direction, at the same time the cap layer extends, after forming the same on the surface 4d of the active semiconductor layer 3, in the downward direction to the substantially identical height level in the trench. The latter corresponds to the height level of the surface 4d minus h9. This intermediate step is not shown.

Illustrated in FIG.3f is the result of the next intermediate step, which is not shown, in which a material removing planarization is performed, for instance by a chemical mechanical polishing process or by a resist. The corresponding process result is shown in FIG. 3f, wherein the opening as described with respect to FIG. 3e is filled with a cap layer 9 to result in a surface F. The active semiconductor layer 3 is also exposed. The isolation trench cap layer 9 may thus be obtained without a mask. The cap layer 9 ensures a suppression of a possible oxidation of the vertical fill material 5*, may simultaneously provide lateral insulation and extends between the trench walls without an intermediate layer of any of the two vertical portions 4a, 4b of the insulating layer 4.

Not illustrated are several layers as a sequence of layers instead of the single cap layer 9 according to FIG. 3f. In this case, individual layers may have specific characteristics in order to affect the expansion behaviour or the getter capability for ions.

If only one cap layer 9 is provided that forms a "cap" of the trench, this layer may be made of silicon nitride which is not oxygen permeable and is electrically sufficiently insulating.

The adjustment of the vertical fill material 5* and the cap layer 9 provides for the avoidance of a bending of the semiconductor wafer during subsequent processes. The upper portion of the filled trench does not oxidise so that different coefficients of expansion may not occur. The adjustment of the vertical insulating layers 4a,4b, the vertical fill material 5* and the cap layer 9 is performed in tailored manner.

In addition to the stability and process safety achieved, a surface F is obtained that does not contain any steps. This especially holds true for the trench and the adjacent areas.

It is not harmful if the vertical fill material 5* is electrically conductive, since the dielectric insulating layers 4a, 4b are provided. It is also not a problem that this fill layer is oxidizable, since the cap layer 9 provides a barrier with respect to oxidation in subsequent high temperature processes.

With respect to the depth of the material removal, it has been mentioned for the transition from FIG. 3c to FIG. 3d that the depth of the trench is not nearly reached and the removed portion having the depth h7 and h9 represents a small volume of the vertical fill material 5*. This is a consequence of the very deep trench structure, which is designed for a high insulation capability and a relatively thick active semiconductor layer 3.The depth of the trench and the width of the trench may be combined to an aspect ratio. This aspect ratio is higher than 10:1 (depth to width), preferably higher than 15:1. In other words, a deep narrow trench is contemplated, which is clearly illustrated in FIG. 4.

In a similar manner, the depth of the second over-etch process has been selected to obtain FIG. 3e. Also in this case the removal is not deeper than down to half of the trench depth at most, typically and preferably significantly less deep in order to not unduly increase the thickness of the cap layer 9, see FIG. 3f. A preferred measure in this case is ¼ of the trench depth or significantly less, when the trench depth corresponds to a situation as illustrated in FIG. 3e or FIG. 4. The trench depth in FIG. 3d is selected differently, since here only the horizontal insulating layers 4a', 4b' are provided, which may have no undue affect with respect to their extension and which are illustrated in an exaggerated manner for the sake of clarity.

The thickness of the cap layer 9 may be less than 1 μm.

REFERENCE SIGNS

1: semiconductor wafer (substrate)
2: buried insulating layer, for instance $SiO_2$
3: active semiconductor layer(s) carrying devices
4: insulating layer, for instance $SiO_2$ (in the form of layer portions 4a, 4b)
5: fill layer, for instance polysilicon, possibly conductive
6: active silicon area at potential 1
7: active silicon area at potential 2
8: oxide layer (pad oxide)
9: cap of the insulating isolation trench, for example, $Si_3N_4$
F: surface (planar)

The invention claimed is:

1. A method of forming a wafer for integrated circuits comprising low voltage elements and high voltage elements, wherein chip regions of different potentials are separated by dielectrically insulating regions formed as isolation trenches extending downward from a first planar surface, at least one of said isolation trenches receiving a material that is oxidizable in an oxygen containing atmosphere at an elevated temperature, said method comprising a sequence of process steps after forming at least two vertical insulating layers in said at least one of said isolation trenches and a horizontal insulating layer on said first planar surface to provide a second planar surface of an insulating layer above said first planar surface, said sequence comprising:
   filling said at least one isolation trench with a fill material until a deepest point of an indentation in a resulting fill material layer formed on said first planar surface has a first level that is above a second level defined by said second planar surface;
   performing a first planarization of said resulting fill material layer;
   removing a first portion of fill material in said at least one of said isolation trenches by a first over-removal down to a defined depth not deeper than down to half of a trench depth;
   removing a portion of at least the vertical insulating layers and over-removing a further portion of the fill material so as to reach a height level substantially equal with said vertical insulating layers within said at least one of said isolation trenches;
   depositing at least one cap layer having a thickness extending above said first planar surface and extending downward to said vertical insulating layers and said fill material within said at least one of said isolation trenches; and
   performing a further planarization of said cap layer by one of a chemical mechanical polishing process and a resist planarization process to form a cover.

2. The method of claim 1, wherein said cover is an oxygen impermeable cap in the form of a layer system.

3. The method of claims 2, wherein the layer system has a plurality of stacked layers.

4. The method of claim 1, wherein said cover is an oxygen impermeable cap provided as a layer comprised of silicon nitride.

5. The method of claim 1, wherein said cover is oxygen impermeable and comprises a plurality of layers at least one of said plurality of layers having a different specific characteristic than at least one other layer.

6. The method of claim 5, wherein said different specific characteristic comprises a specified coefficient of extension.

7. The method of claim 5, wherein said different specific characteristic comprises getter capabilities for ions.

8. The method of claim 1, wherein said process wafer is a silicon on insulator wafer including a buried insulating layer formed on a carrier layer.

9. The method of claim 1, wherein the fill material in said trench and said cover is adjusted so as to reduce a bending of the wafer during further processing.

10. The method of claim 1, wherein surfaces of said cover and exposed chip regions define a continuous plane for low voltage elements and high voltage elements.

11. The method of claim 10, wherein the continuous plane lacks steps in a trench area and adjacent areas.

12. The method of claim 1, wherein said vertical and horizontal insulating layers are formed by a thermal oxidation.

13. The method of claim 1, wherein said fill material is polysilicon.

14. The method of claim 1, wherein removal of said vertical insulating layers and fill material in said at least one of said isolation trenches is performed with a defined measure of depth removal by an etch process.

15. The method of claim 1, wherein no more than one mask is used for forming said at least one of said isolation trenches.

16. The method of claim 1, wherein removal of said fill material located within said at least one of said isolation trenches is a defined etching back.

17. The method of claim 1, wherein said cover positioned within said trench performs both vertically and laterally acting insulation across an entire trench width.

18. The method of claim 1, wherein said cover is dielectrically insulating.

19. The method of claim 1, wherein said low voltage elements are logic elements.

20. The method of claim 1, wherein said high voltage elements are power elements.

21. The method of claim 1, wherein said low voltage elements and said high voltage elements are located in an active semiconductor layer.

22. The method of claim 21, wherein said active semiconductor layer extends horizontally and is bordered in a vertical direction by a buried insulating layer.

23. The method of claim 1, wherein at least one of said isolation trenches is formed in an active semiconductor layer to a lower end thereof at a buried insulating layer.

24. The method of claim 1, wherein said fill material is one of electrically conductive and oxidizable.

25. The method of claim 1, wherein over-removal of said further portion of said fill material within said at least one of said isolation trenches reaches not deeper than down to half of the trench depth.

26. The method of claim 1, wherein a trench depth in an active semiconductor layer is greater than 10 μm.

27. The method of claim 1, wherein said at least one isolation trench has an aspect ratio of depth to width that is greater than 10:1.

28. The method of claim 1, wherein said vertical insulating layers at both trench walls are formed down to a horizontal insulating layer.

29. The method of claim 1, wherein depositing at least one of a cap layer and a layer system as a cover is performed without a mask.

30. A wafer for integrated circuits comprising low voltage elements and high voltage elements, wherein chip regions of different potentials are separated by dielectrically insulating regions formed as isolation trenches extending downward from a first planar surface, at least one of said isolation trenches receiving a material that is oxidizable in an oxygen containing atmosphere at an elevated temperature and two vertical insulating layers formed in said at least one of said isolation trenches and a horizontal insulating layer on said first planar surface to provide a second planar surface of an insulating layer above said first planar surface prepared by a process comprising the steps of:

filling said at least one isolation trench with a fill material until a deepest point of an indentation in a resulting fill material layer formed on said first planar surface has a first level that is above a second level defined by said second planar surface;

performing a first planarization of said resulting fill material layer;

removing a first portion of fill material in said at least one of said isolation trenches by a first over-removal down to a defined depth not deeper than down to half of a trench depth;

removing a portion of at least the vertical insulating layers and over-removing a further portion of the fill material so as to reach a height level substantially equal with said vertical insulating layers within said at least one of said isolation trenches;

depositing at least one cap layer having a thickness extending above said first planar surface and extending downward to said vertical insulating layers and said fill material within said at least one of said isolation trenches; and     performing a further planarization of said cap layer by one of a chemical mechanical polishing process and a resist planarization process to form a cover.

31. A method of forming electric circuits, said electric circuits having integrated therein low voltage logic elements and high voltage power elements and having chip regions of different potentials being separated from one another by dielectrically insulating isolation trenches extending from a planar surface and including materials capable of oxidizing at elevated temperatures in an oxygen containing atmosphere, said method including forming insulating layers and further comprising:

filling said isolation trenches with fill material until a deepest portion of indentations of formed fill material layers are positioned above a planar surface defined by said insulating layers;

planarizing the fill material;

removing said fill material in said isolation trenches to a defined depth not deeper than down to half of a trench depth by over-etching;

etching said insulating layers and over-etching said fill material so as to obtain a substantially equal height level of said insulating layers and said fill material within said isolation trenches;

depositing at least one of a cap layer and a layer system with a thickness that extends above the level of said planar surface, said at least one of the cap layer and the layer system is an oxygen impermeable layer comprised of silicon nitride; and     planarizing said at least one of the cap layer and the layer system by at least one of a chemical mechanical polishing and a resist planarization process.

32. The method of claim 31, wherein said at least one of the cap layer and the layer system comprises a plurality of stacked layers including an oxygen impermeable layer and layers of other specific characteristics.

\* \* \* \* \*